(12) United States Patent
Chieh et al.

(10) Patent No.: US 9,337,223 B2
(45) Date of Patent: May 10, 2016

(54) IMAGING SYSTEMS WITH IMAGE PIXELS HAVING ADJUSTABLE RESPONSIVITY

(71) Applicant: Semiconductor Components Industries, LLC, Phoenix, AZ (US)

(72) Inventors: Shung Chieh, Sunnyvale, CA (US); Brian Keelan, Boulder Creek, CA (US)

(73) Assignee: SEMICONDUCTOR COMPONENTS INDUSTRIESS, LLC, Phoenix, AZ (US)

( * ) Notice: Subject to any disclaimer, the term of this patent is extended or adjusted under 35 U.S.C. 154(b) by 88 days.

(21) Appl. No.: 14/089,557

(22) Filed: Nov. 25, 2013

(65) Prior Publication Data
US 2015/0145007 A1 May 28, 2015

(51) Int. Cl.
*H01L 27/146* (2006.01)
(52) U.S. Cl.
CPC ........ *H01L 27/1461* (2013.01); *H01L 27/1464* (2013.01); *H01L 27/14612* (2013.01)
(58) Field of Classification Search
CPC ................. H01L 27/14607; H01L 27/14647; H01L 27/14621; H01L 27/1461
See application file for complete search history.

(56) References Cited

U.S. PATENT DOCUMENTS

| 6,680,498 | B2 | 1/2004 | Guidash | |
|---|---|---|---|---|
| 7,075,049 | B2 | 7/2006 | Rhodes et al. | |
| 8,274,587 | B2 | 9/2012 | Hynecek | |
| 8,866,945 | B2* | 10/2014 | Tay | 348/280 |
| 2009/0200584 | A1* | 8/2009 | Tweet | H01L 27/14641 257/292 |
| 2009/0207287 | A1* | 8/2009 | Miya et al. | 348/273 |
| 2013/0214161 | A1* | 8/2013 | Cazaux | H01L 27/14621 250/338.4 |
| 2014/0103411 | A1* | 4/2014 | Dai | H01L 27/14609 257/292 |
| 2015/0060951 | A1* | 3/2015 | Hynecek | H01L 27/14612 257/228 |

FOREIGN PATENT DOCUMENTS

EP 2009911 12/2008

\* cited by examiner

*Primary Examiner* — Allen Parker
*Assistant Examiner* — Stephen Bradley
(74) *Attorney, Agent, or Firm* — Treyz Law Group, P.C.; Kendall P. Woodruff; Joseph F. Guihan (57) ABSTRACT

An imaging system may include an image sensor having an array of image pixels. Some image pixels in the array may be provided with responsivity adjustment structures. For example, broadband pixels in a pixel array may include responsivity adjustment circuitry. The responsivity adjustment circuitry may be configured to narrow the spectral response or to reduce the conversion gain of the broadband pixels in high light conditions. For example, a deep photodiode may divert charge away from a signal photodiode during an integration period. The deep photodiode may divert charge to a power supply or the charge may be transferred to a storage node and used in image processing, if desired. The responsivity adjustment circuitry may include channel-dependent conversion circuitry that is formed in pixels corresponding to a first color channel, while the conversion gains of pixels corresponding to a second color channel may remain fixed.

14 Claims, 7 Drawing Sheets

IMAGING SYSTEMS WITH IMAGE PIXELS HAVING ADJUSTABLE RESPONSIVITY

BACKGROUND

This relates generally to imaging systems, and more particularly, to imaging systems that include image pixels with adjustable responsivity.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

In some imaging systems, broadband pixels such as clear pixels and/or yellow pixels may be used to improve the signal-to-noise ratio (SNR) of an image sensor at lower exposure levels. For example, some imaging systems employ an image sensor having clear, red, and blue pixels, without any green pixels. In this type of imaging system, a green signal is determined based on a weighted subtraction of the red and blue signals from the clear signal. This approach has various advantages, such as high resolving power and freedom from chromatic aliasing and associated color artifacts.

However, conventional image sensors having clear pixels often experience negative effects at high light levels. For example, the higher sensitivity of the clear pixel may be nullified by shorter integration times that are required to avoid clipping. The red and blue exposures become shorter by a corresponding amount, which in turn results in reduced chromatic SNR. Additionally, conventional image sensors having clear pixels require a stronger color correction matrix (CCM) to convert RCB data to sRGB data, which can amplify noise and artifacts.

It would therefore be desirable to be able to provide imaging systems with improved signal-to-noise ratio and reduced amplification of noise and image artifacts.

DETAILED DESCRIPTION

Electronic devices such as digital cameras, computers, cellular telephones, and other electronic devices include image sensors that gather incoming light to capture an image. An image sensor may include an array of image pixels. Each image pixel may include a photosensitive element such as a photodiode that converts the incoming light into image signals. An image sensor may have any number of pixels (e.g., hundreds, thousands, millions or more). A typical image sensor may, for example, have hundreds of thousands or millions of pixels (e.g., megapixels).

Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
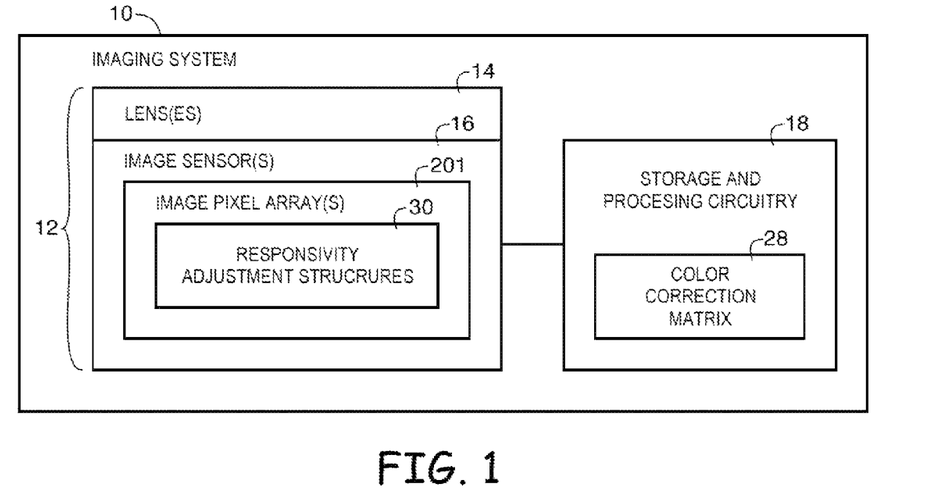
FIG. 1 is a diagram of an illustrative imaging system that may include an image sensor having an image pixel array with responsivity adjustment structures in accordance with an embodiment of the present invention.

FIG. 1 is a diagram of an illustrative electronic device that uses an image sensor to capture images. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18. If desired, camera module 12 may be provided with an array of lenses 14 and an array of corresponding image sensors 16.

Image sensor 16 may include one or more arrays of image pixels such as image pixel array 201. Image pixel array 201 may include responsivity adjustment structures such as responsivity adjustment structures 30 that are configured to adjust the responsivity of one or more pixels in pixel array 201 during operation of image sensor 16. The responsivity of a pixel may be adjusted in response to information such as image information, camera metadata information, environmental information, exposing light level information, and/or user input information. For example, responsivity adjustment structures 30 may be configured to narrow the spectral response of one or more pixels in pixel array 201 in response to increasing intensity of light incident on pixel array 201. As another example, responsivity adjustment structures 30 may include channel-dependent conversion gain circuitry that adjusts the conversion gain of pixels corresponding to a particular color channel.

If desired, responsivity adjustment structures 30 may adjust the responsivity of some pixels in array 201 while leaving the responsivity of other pixels in array 201 unadjusted. For example, pixel array 201 may include an array of red, blue, and broadband pixels (e.g., broadband pixels such as clear pixels and/or yellow pixels). Responsivity adjustment structures 30 may adjust the responsivity of the broadband pixels in array 201 while leaving the responsivity of the red and blue pixels in array 201 unadjusted. This type of arrangement may improve the signal-to-noise (SNR) ratio associated with image signals from the red and blue pixels. Narrowing the responsivity of broadband pixels at higher light levels may also allow the use of a milder color correction matrix (CCM), which in turn leads to reduced amplification of noise and artifacts.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12. For example, processing circuitry 18 may include circuitry that forms part of an integrated circuit that includes image sensor 16 and/or may include circuitry that forms part of an integrated circuit within module 12 that is associated with image sensor 16. Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Processing circuitry 18 may use a color correction matrix (CCM) such as CCM 28 to convert image data into standard R, G, and B values (e.g., sRGB) for a display. The values in CCM 28 may be determined based on the spectral characteristics of image sensor 16 (e.g., spectral characteristics of lens 14, spectral characteristics of filters in image sensor 16, the state of responsivity adjustment structures 30, etc.), based on lighting conditions such as light level and illuminant information (e.g., daylight, tungsten, fluorescent, etc.), and/or based on other characteristics of the system or scene being captured. CCM 28 may also be used to correct for crosstalk and spectral overlap.

The "strength" of a CCM is indicated by the values on the diagonal of the matrix. A unit matrix with ones on the diagonal and zeros off-diagonal would make no correction; stronger corrections require larger positive values on the diagonal and more negative values off-diagonal. A conventional image sensor having clear pixels instead of green pixels requires a stronger CCM than a Bayer sensor in order to convert clear pixel signals to green pixel signals. As the strength of the CCM increases, it can amplify uncorrelated noise and certain artifacts within a system.

The use of responsivity adjustment structures 30 in image sensor 16 may allow CCM 28 to be "milder" than that of a typical image sensor with clear pixels (e.g., CCM 28 may have lower on-diagonal values than that of a typical image sensor with clear pixels). For example, responsivity adjustment structures 30 may adjust the spectral response of broadband pixels in high light levels to be closer to that of green pixels. This in turn means that the strength of corrections needed in CCM 28 may be reduced. Processing circuitry 18 may determine the values of CCM 28 based at least partly on the state of responsivity adjustment structures 30 (e.g., based on an amount by which responsivity adjustment structures 30 have adjusted the responsivity of pixels in array 201).

Figure 2:
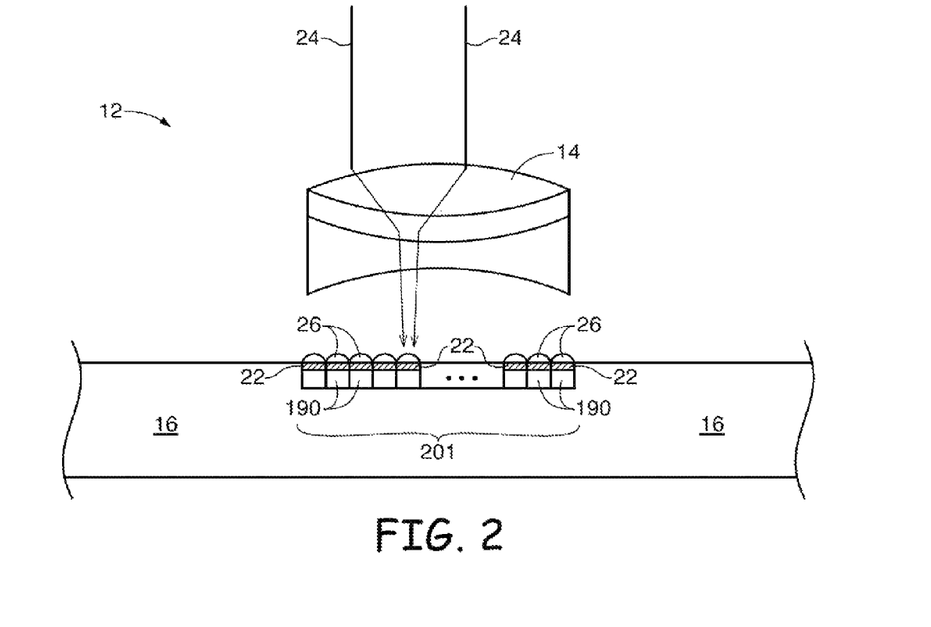
FIG. 2 is cross-sectional side view of an illustrative camera module having a lens that focuses image light onto an image pixel array in accordance with an embodiment of the present invention.

As shown in FIG. 2, image sensor 16 may include image pixel array 201 having an array of image sensor pixels 190 (sometimes referred to herein as image pixels 190). Array 201 may contain, for example, hundreds or thousands of rows and columns of image sensor pixels 190.

Image pixel array 201 may include an array of color filter elements such as color filter elements 22. Each color filter element 22 may be formed over a photosensitive element in an associated one of image pixels 190. The array of color filter elements 22 may be covered by a corresponding array of microlenses such as microlenses 26. Color filter elements 22 may include red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), and/or color filter elements of other colors (e.g., cyan, magenta, etc.). If desired, some image pixels 190 may not include color filter elements. Image pixels that do not include color filter elements and image pixels that are provided with clear color filter elements may sometimes be referred to as clear pixels, white pixels, clear image pixels, or white image pixels.

Filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Similarly, image pixels that include a broadband color filter element (e.g., a yellow or clear color filter element) and that are therefore sensitive to two or more colors of light (e.g., two or more colors of light selected from the group that includes red light, blue light, and green light) may sometimes be referred to herein as broadband pixels or broadband image pixels. In contrast, "colored" pixel may be used herein to refer to image pixels that are primarily sensitive to one color of light (e.g., red light, blue light, green light, or light of any other suitable color).

Pixel array 201 may include one or more broadband pixels such as broadband pixels 190C. Broadband pixels 190C may be interspersed among colored pixels in array 201 in any suitable pattern. For example, pixel array 201 may have a Bayer-like pattern having broadband pixels in the place of green pixels. This type of color filter pattern is sometimes referred to as RCCB, as each unit pixel may have a red subpixel, two clear or yellow subpixels, and a blue subpixel. This is, however, merely illustrative. If desired, any other suitable pattern may be used.

Responsivity adjustment structures 30 (FIG. 1) may be located in all pixels 190 or may be located only in a group of pixels 190 such as broadband pixels 190C. In another suitable arrangement, responsivity adjustment structures 30 may be located in all pixels 190 but may only be active in broadband pixels 190C (if desired). In configurations where spectral response adjustment structures 30 are located in colored pixels 190 (e.g., in red and/or blue pixels), the spectral response of colored pixels 190 may be adjusted based on illuminant color temperature (as an example).

Responsivity adjustment structures 30 may be incorporated into the pixel circuitry of broadband pixels 190C. Responsivity adjustment structures 30 may be configured to adjust the responsivity of broadband pixels 190C based on the intensity of incident light 24. For example, when the intensity of incident light 24 is high (e.g., above a threshold intensity), responsivity adjustment structures 30 may narrow the spectral response of broadband pixels 190C (e.g., may adjust the spectral response of broadband pixels 190C to be closer to that of a green pixel). When the intensity of incident light 24 is low (e.g., below a threshold intensity), responsivity adjustment structures 30 may leave the spectral response of broadband pixels 190C unadjusted or, in cases where the spectral response is in a narrowed state, may increase the spectral response to be equivalent to a broadband pixel. In some configurations, the spectral response of broadband pixels 190C may vary continuously as the light level changes.

In another suitable embodiment, responsivity adjustment structures 30 may include channel-dependent conversion gain circuitry that reduces the conversion gain of broadband pixels 190C in high light conditions. In the case where the floating diffusion limits the pixel capacity, reducing the conversion gain of broadband pixels in high light conditions may allow the red and blue pixels 190 to be exposed as long as needed without the risk of overexposing broadband pixels 190C. Reducing the broadband pixel conversion gain in this way may also allow increased exposure to color channels at high light levels without incurring the chromatic motion artifacts associated with having different integration times for different channels. Alternatively, one may choose to increase the conversion gain for the red and blue pixels to boost their signals in high light conditions.

Figure 3:
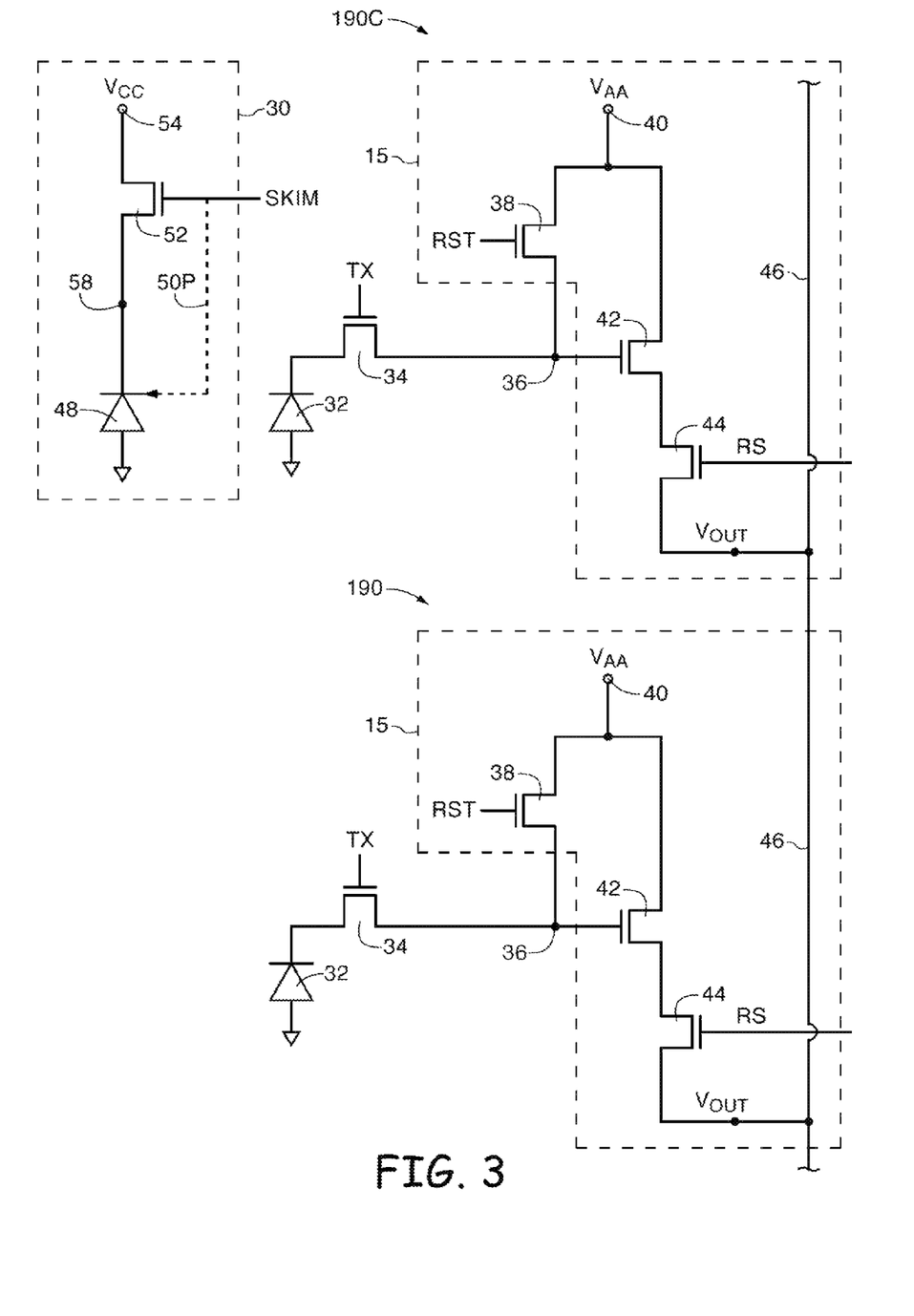
FIG. 3 is a circuit diagram of illustrative image pixels including an image pixel with responsivity adjustment structures in accordance with an embodiment of the present invention.

FIG. 3 is a circuit diagram of illustrative image pixels 190 and 190C in pixel array 201. As shown in FIG. 3, some image pixels in pixel array 201 such as image pixel 190C (in the upper portion of FIG. 3) may include responsivity adjustment circuitry 30, whereas other image pixels in pixel array 201 such as image pixel 190 (in the lower portion of FIG. 3) may not include responsivity adjustment circuitry 30. In one suitable arrangement, image pixel 190C is a broadband pixel and image pixel 190 is a colored pixel (e.g., a red pixel, a blue pixel, or a pixel of any other suitable color). This is, however, merely illustrative. If desired, responsivity adjustment circuitry 30 may be formed in colored pixels 190 or in any other suitable image pixel in array 201. Arrangements in which broadband pixels 190C include responsivity adjustment circuitry 30 and colored pixels do not include responsivity adjustment circuitry 30 are sometimes described herein as an example.

Pixels 190 and 190C may each include a photosensitive element such as signal photodiode 32. Photodiode 32 may generate charge (e.g., electrons) in response to receiving impinging photons. The amount of charge that is collected by photodiode 32 may depend on the intensity of the impinging light and the exposure duration (or integration time).

A positive power supply voltage Vaa may be supplied at positive power supply terminal 40. Before an image is acquired, reset control signals RST may be asserted. Asserting signal RST turns on reset transistor 38 and resets charge storage node 36 (sometimes referred to as a floating diffusion region FD) to Vaa. Reset control signal RST may then be deasserted to turn off reset transistor 38.

As shown in FIG. 3, pixels 190 and 190C may each include a transfer gate (transistor) 34. Transfer gate 34 may have a gate terminal that is controlled by transfer control signal TX. At the end of an integration period, transfer signal TX may be pulsed to transfer photo-generated charge from photodiode 32 to floating diffusion region 36. Floating diffusion region 36 may be a doped semiconductor region (e.g., a region in a silicon substrate that is doped by ion implantation, impurity diffusion, or other doping process).

Pixels 190 and 190C may each include readout circuitry such as charge readout circuitry 15. Charge readout circuit 15 may include row-select transistor 44 and source-follower transistor 42. Transistor 44 may have a gate that is controlled by row select signal RS. When signal RS is asserted, transistor 44 is turned on and a corresponding signal Vout (e.g. an output signal having a magnitude that is proportional to the amount of charge at floating diffusion node 36), is passed onto output path 46.

In a typical image pixel array configuration, there are numerous rows and columns of image pixels. A column readout path such as output line 46 may be associated with each column of image pixels (e.g. each image pixel 190 and 190C in a column may be coupled to output line 46 through an associated row-select transistor 44). Signal RS may be asserted to read out signal Vout from a selected image pixel onto column readout path 46. Image data Vout may be fed to processing circuitry 18 for further processing. The circuitry of FIG. 3 is merely illustrative. If desired, pixels 190 and 190C may include other pixel circuitry.

As shown in FIG. 3, broadband pixel 190C may also include responsivity adjustment circuitry 30. Responsivity adjustment circuitry 30 may include an additional photodiode such as responsivity adjustment photodiode 48. Responsivity adjustment photodiode 48 may be electrically coupled to a power supply terminal such as power supply terminal 54 through a node such as node 58. A transistor such as transistor 52 may be coupled between photodiode 48 and power supply terminal 54. A supply voltage such as supply voltage Vcc may be supplied at power supply terminal 54. Supply voltage Vcc may be the same supply voltage as Vaa, or may be a different supply voltage.

Transistor 52 may have a gate terminal that is controlled by responsivity control signal SKIM. When signal SKIM is asserted, transistor 52 turns on and responsivity adjustment photodiode 48 becomes biased by voltage Vcc from power supply terminal 54. When biased during an exposure period, photodiode 48 begins to collect electrons that are generated by photons in the vicinity of photodiode 48. For example, photodiode 48 may collect electrons that are generated primarily by red photons, thereby attenuating the red response of signal photodiode 32. Charge collected by photodiode 48 may be passed to supply terminal 54. When signal SKIM is deasserted, transistor 52 turns off and responsivity adjustment photodiode 48 is no longer biased. When photodiode 48 is not biased, photodiode 48 is no longer diverting charge to supply terminal 54 and the spectral response of signal photodiode 32 may be enhanced (as the red response is longer no being attenuated). Signal SKIM may be zero (ground) or high (e.g., Vaa). If desired, transistor 52 and its control line may be located in pixel 190C or may be located at a column level or row level outside of pixel 190C.

In an optional configuration, photodiode 48 may be a gated photodiode having a control input that receives a control signal such as control signal SKIM on path 50P. When signal SKIM is asserted, the gate of photodiode 48 may be biased to increase the collection area of photodiode 48. When signal SKIM is deasserted, the gate may be biased to increase spectral response of signal photodiode 32. This configuration is merely illustrative, however. Photodiode 48 need not be a gated photodiode and control path 50P may be omitted, if desired.

Image sensor control circuitry such as processing circuitry 18 may be configured to control the operation of responsivity adjustment circuitry 30. When it is desired to narrow the spectral response of broadband pixel 190C, control circuitry 18 may send control signals to pixel array 201 to assert signal SKIM so that the sensitivity of broadband pixel 190C is reduced. When it is desired to have the full spectral response of broadband pixel 190C, control circuitry 18 may send control signals to pixel array 201 to deassert signal SKIM so that the sensitivity of the broadband pixel 190C remains that of a broadband pixel. Control circuitry 18 may control responsivity adjustment circuitry 30 based on information such as image information, camera metadata information, environmental information, exposing light level information, and/or user input information.

Figure 4:
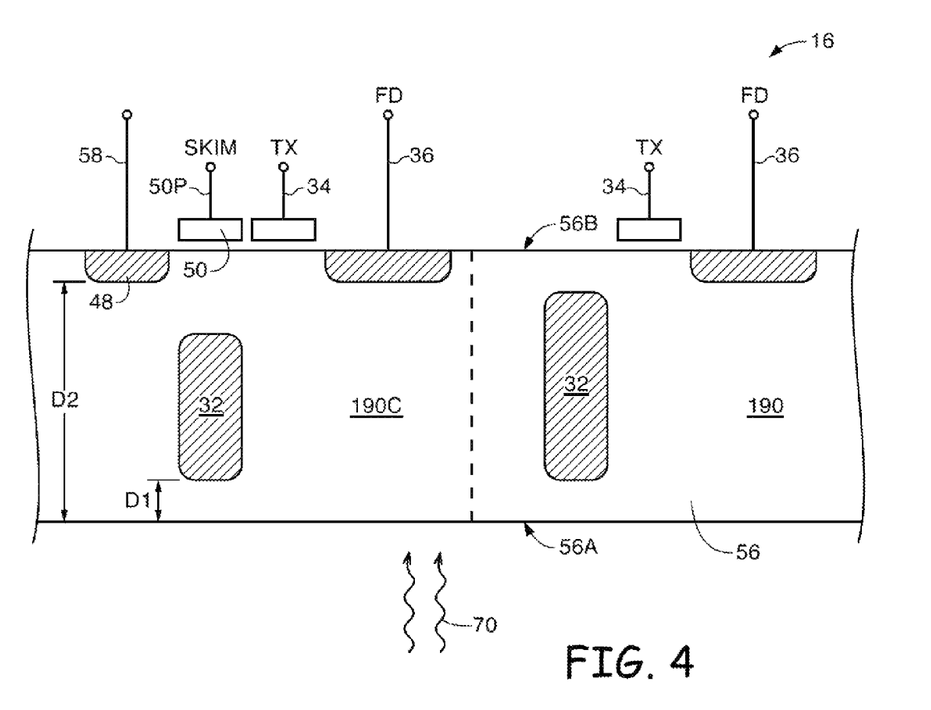
FIG. 4 is a cross-sectional side view of image pixels of the type shown in FIG. 3 in accordance with an embodiment of the present invention.

A cross-sectional side view of image pixels 190 and 190C of FIG. 3 is shown in FIG. 4. As shown in FIG. 4, image pixels 190 and 190C may be formed in an image sensor substrate such as silicon substrate 56. In the illustrative example of FIG. 4, image sensor 16 may be a backside illuminated (BSI) illuminated image sensor in which light 70 enters image sensor 16 through surface 56A of silicon substrate 56 and in which metal control lines are formed adjacent to opposing surface 56B of silicon substrate 56. The shaded portions of FIG. 4 indicate oppositely doped portions of silicon 56 from non-shaded portions of silicon 56. For example, shaded portions of substrate 56 may correspond to n-doped regions of silicon, where as non-shaded portions of substrate 56 may correspond to p-doped regions of silicon. If desired, other doping configurations may be used.

In general, longer wavelengths of light (e.g., red and infrared light) tend to penetrate deeper into silicon than shorter wavelengths of light (e.g., green and blue light). For example, shorter wavelengths of light may be absorbed and may generate electrons at distance D1 from light-entering surface 56A of silicon substrate 56, whereas longer wavelengths of light may be absorbed and may generate electrons at distance D2. This characteristic may be used to electrically adjust the spectral response of image pixel 190C.

As shown in FIG. 4, responsivity adjustment photodiode 48 may be formed at surface 56B of substrate 56, a distance D2 from light-entering surface 56A. Signal photodiode 32 may be embedded in substrate 56, a distance D1 from light-entering surface 56A of substrate 56. Distance D1 may be shorter than distance D2 such that signal photodiode 32 is a "shallow" photodiode compared to "deep" photodiode 48. In this case, depth may be measured from light-entering surface 56A of substrate 56.

Thus, when biased (e.g., when signal SKIM is asserted and transistor 52 of FIG. 3 is turned on), photodiode 48 begins to collect electrons that are generated by photons in the vicinity of photodiode 48 at depth D2. For example, photodiode 48 may collect electrons that are generated primarily by red photons that penetrate deeper into substrate 56 than green and blue photons, thereby attenuating the red response of signal photodiode 32. Charge collected by photodiode 48 may be passed to supply terminal 54 through node 58. When photodiode 48 is not biased (e.g., when signal SKIM is deasserted and transistor 52 of FIG. 3 is turned off), photodiode 48 is no longer diverting charge to supply terminal 54 and the spectral response of signal photodiode 32 may be enhanced (as the red response is longer being attenuated). Photodiode 48 may sometimes be referred to as a skimming photodiode because it is configured to "skim" electrons generated in its vicinity.

As described in connection with FIG. 3, photodiode 48 may, if desired, be a gated photodiode having a gate such as gate 50. Gate 50 may be controlled by signal SKIM on control path 50P. Gate 50 may be used increase or decrease the skimming effect of responsivity adjustment photodiode 48. When signal SKIM is asserted, gate 50 may be biased to invert the underlying silicon in substrate 56, thereby increasing the collection area of photodiode 48 and diverting more electrons away from signal photodiode 32. When signal SKIM is deasserted, gate 50 may be biased to accumulate the underlying silicon in substrate 56, thereby creating a vertical field that drives electrons towards signal photodiode 32. The use of gate 50 is, however, merely illustrative. If desired, gate 50 may be omitted from responsivity adjustment circuitry 30.

Figure 5:
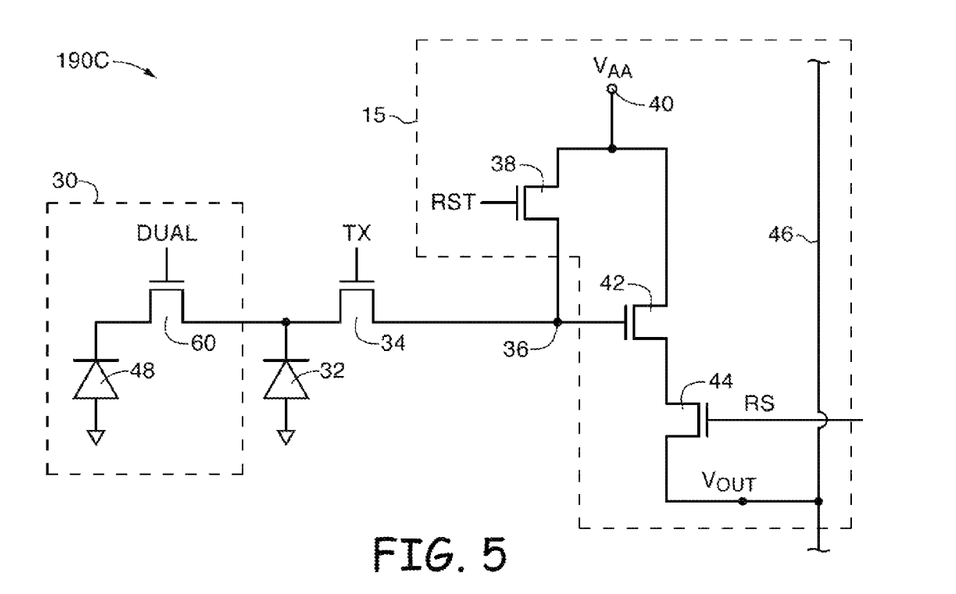
FIG. 5 is a circuit diagram of an illustrative image pixel having responsivity adjustment structures in accordance with an embodiment of the present invention.

FIG. 5 is a circuit diagram illustrating another suitable embodiment in which responsivity adjustment circuitry 30 includes responsivity adjustment photodiode 48 coupled to signal photodiode 32 through a switch such as transistor 60. Transistor 60 may have a gate that is controlled by control signal DUAL. When control signal DUAL is asserted during a charge integration period, photodiode 48 may be connected to photodiode 32 and both photodiodes collect charge in response to red, green, and blue light. At the end of the integration period, charge from photodiode 48 and photodiode 32 is transferred to floating diffusion 36 by pulsing gate 60 and transfer gate 34 at the same time.

When control signal DUAL is deasserted during a charge integration period, photodiode 48 may be disconnected from photodiode 32. Photodiode 48 may collect charge generated by photons in its vicinity, while photodiode 32 may collect charge generated by photons in its vicinity. At the end of the integration period, charge from signal photodiode 32 may first be transferred to floating diffusion 36 by pulsing transfer gate 34 while transistor 60 is off. Charge from responsivity adjustment photodiode 48 may then be transferred to floating diffusion 36 by pulsing transfer gate 34 while transistor 60 is on.

This configuration differs from that of FIG. 3 in that charge collected by responsivity photodiode 48 can be read out to column output line 46 using readout circuitry 15 and can be used in image processing, if desired. For example, in configurations where responsivity photodiode 48 collects electrons that are generated primarily by red photons, signals read out from photodiode 48 may be used to supplement red pixel signals from red pixels in array 201 (if desired).

Image sensor control circuitry such as processing circuitry 18 may be configured to control the operation of responsivity adjustment circuitry 30. When it is desired to narrow the spectral response of signal photodiode 32, control circuitry 18 may send control signals to pixel array 201 to deassert signal DUAL to turn transistor 60 off and thereby separately collect charge in photodiode 48 and photodiode 32. When it is desired to use the full spectral sensitivity of both photodiode 48 and photodiode 32, control circuitry 18 may send control signals to pixel array 201 to assert signal DUAL to turn transistor 60 on and thereby collect charge using both photodiode 48 and photodiode 32. Control circuitry 18 may control responsivity adjustment circuitry 30 based on information such as image information, camera metadata information, environmental information, exposing light level information, and/or user input information.

Figure 6:
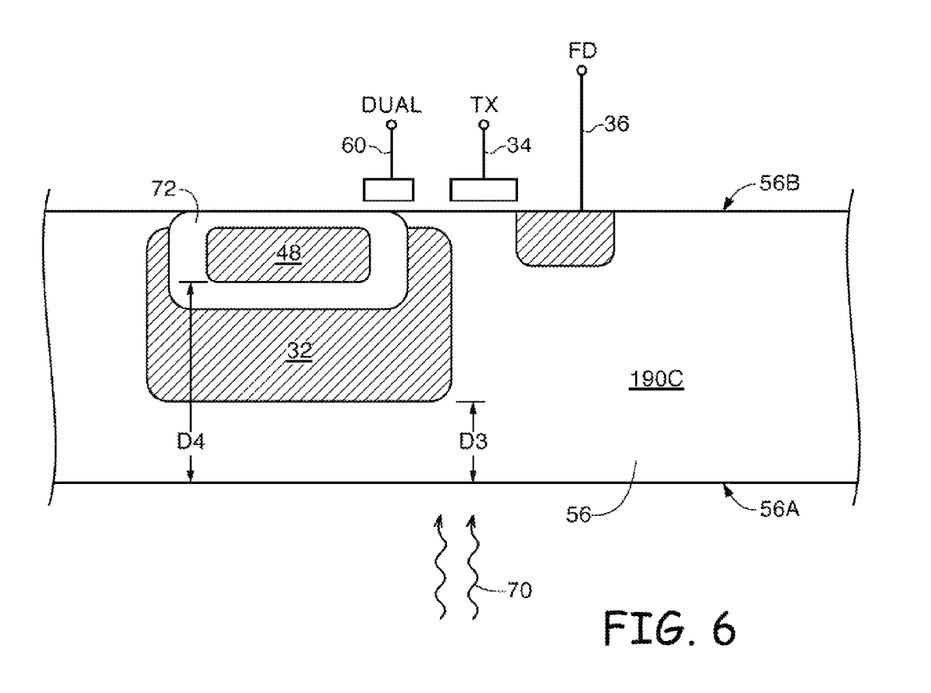
FIG. 6 is a cross-sectional side view of an image pixel of the type shown in FIG. 5 in accordance with an embodiment of the present invention.

A cross-sectional side view of image pixel 190C of FIG. 5 is shown in FIG. 6. As shown in FIG. 6, image pixel 190C may be formed in an image sensor substrate such as silicon substrate 56. In the illustrative example of FIG. 6, image sensor 16 may be a backside illuminated (BSI) illuminated image sensor in which light 70 enters image sensor 16 through surface 56A of silicon substrate 56 and in which metal control lines are formed adjacent to opposing surface 56B of silicon substrate 56. The shaded portions of FIG. 6 indicate oppositely doped portions of silicon 56 from non-shaded portions of silicon 56. For example, shaded portions of substrate 56 may correspond to n-doped regions of silicon, where as non-shaded portions of substrate 56 may correspond to p-doped regions of silicon. If desired, other doping configurations may be used.

As shown in FIG. 6, responsivity adjustment photodiode 48 and signal photodiode 32 may be stacked. Photodiode 48 may be partially surrounded by photodiode 32. An oppositely doped region of silicon such as region 72 may be interposed between photodiode 48 and photodiode 32. For example, photodiode regions 48 and 32 may be n-doped regions, and region 72 may be a p-doped region, if desired.

Responsivity adjustment photodiode 48 may be embedded in substrate 56, a distance D4 from light-entering surface 56A. Signal photodiode 32 may be embedded in substrate 56, a distance D3 from light-entering surface 56A of substrate 56. Distance D3 may be shorter than distance D4 such that signal photodiode 32 is a "shallow" photodiode compared to "deep" photodiode 48. In this case, depth may be measured from light-entering surface 56A of substrate 56.

Thus, during a charge integration period, photodiode 48 begins to collect electrons that are generated by photons in the vicinity of photodiode 48 at depth D4. For example, photodiode 48 may collect electrons that are generated primarily by red photons that penetrate deeper into substrate 56 than green and blue photons, thereby attenuating the red response of signal photodiode 32. Photodiode 32 may collect electrons that are generated primarily by blue and green photons, and by red photons that do not reach photodiode 48. When it is desired to use the full spectral sensitivity of both photodiode 48 and photodiode 32 (e.g., in low light conditions), transistor 60 may be turned on so that the pixel signal from broadband pixel 190C includes the combined charge from photodiodes 48 and 32. When it is desired to reduce the spectral sensitivity of signal photodiode 32 (e.g., in high light conditions), transistor 60 may be turned off so that the charge collected by photodiode 48 is separated from the charge collected by photodiode 32.

Figure 7:
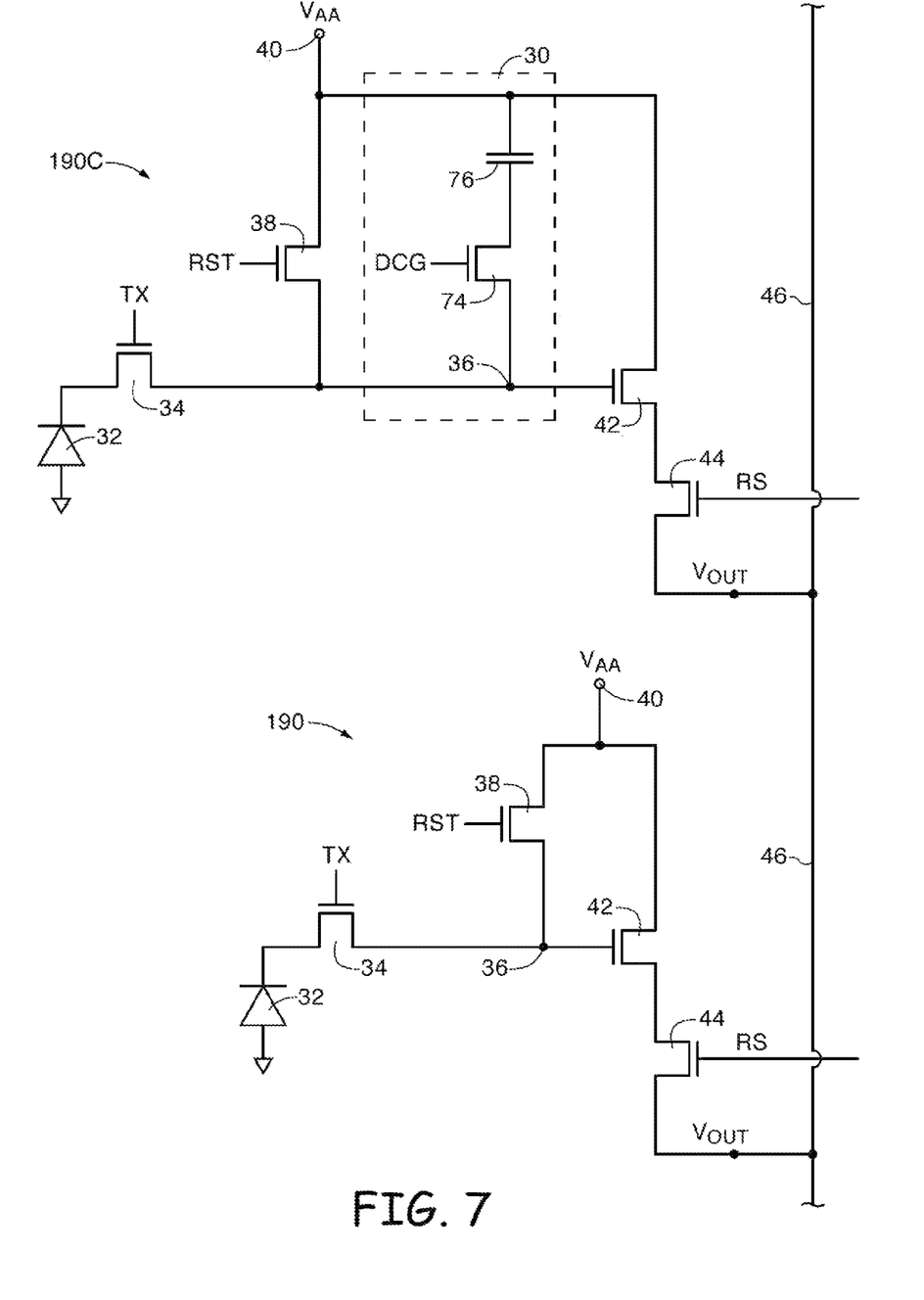
FIG. 7 is a circuit diagram of illustrative image pixels including an image pixel with responsivity adjustment structures such as channel-dependent conversion gain circuitry in accordance with an embodiment of the present invention.

FIG. 7 is a circuit diagram illustrating another suitable embodiment in which the responsivity of image pixels is adjusted through channel-dependent conversion gain circuitry. As shown in FIG. 7, some pixels in pixel array 201 such as broadband pixels 190C may have gain selection circuitry while other pixels in pixel array 201 such as colored pixels 190 may not have gain selection circuitry. Colored pixel 190 has similar pixel circuitry to that of colored pixel 190 of FIG. 3. Broadband pixel 190C has similar pixel circuitry to that of colored pixel 190 except that broadband pixel 190C has been provided with responsivity adjustment circuitry such as gain selection circuitry 30 for adjusting the conversion gain of broadband pixel 190C.

Gain selection circuitry 30 may include capacitor 76 and transistor 74 coupled in series between positive power supply terminal 40 and floating diffusion node 36. Transistor 74 may have a gate terminal that is controlled using dual conversion gain signal DCG. Broadband pixel 190C may be operable in first and second modes such as a high conversion gain mode and a low conversion gain mode. If transistor 74 is disabled (e.g., if signal DCG is low), broadband pixel 190C may be placed in a high conversion gain mode. If transistor 74 is enabled (e.g., if signal DCG is high), broadband pixel 190C may be placed in a low conversion gain mode.

In general, pixel conversion gain is inversely proportional to the amount of loading capacitance at node 36. When transistor 74 is turned on, capacitor 76 is switched into use in order to provide floating diffusion node 36 with additional capacitance. This results in a lower conversion gain for pixel 190C. When transistor 74 is turned off, the additional loading of capacitor 76 is removed and pixel 190C reverts to a relatively higher pixel conversion gain configuration.

Image sensor control circuitry such as processing circuitry 18 may be configured to control the operation of gain selection circuitry 30. When it is desired to reduce the conversion gain of broadband pixels 190C (e.g., in high light conditions), control circuitry 18 may send control signals to pixel array 201 to assert signal DCG to connect capacitor 76 to floating diffusion node 36. When it is desired to increase the conversion gain of broadband pixel 190C (e.g., in low light conditions), control circuitry 18 may send control signals to pixel array 201 to deassert signal DCG to disconnect capacitor 76 from floating diffusion node 36. Control circuitry 18 may control responsivity adjustment circuitry 30 based on information such as image information, camera metadata information, environmental information, exposing light level information, and/or user input information.

This type of channel-dependent conversion gain circuitry allows the conversion gain of broadband pixels 190C to be controlled independently of the conversion gain of colored pixels 190. This allows the conversion gain of broadband pixels 190C to be reduced at high light levels when the broadband channel may otherwise be at risk of saturating. Reducing the conversion gain of broadband pixels 190C while the conversion gain of colored pixels 190 remains fixed allows a longer integration time to be used for all channels in image sensor 16, increasing the SNR of color channels while leaving the SNR of the broadband channel unaffected.

The example of FIG. 7 in which broadband pixels 190C have gain selection circuitry and colored pixels 190 do not have gain selection circuitry is merely illustrative. If desired, both broadband pixels 190C and colored pixels 190 may have gain selection circuitry or broadband pixels 190C may not have gain selection circuitry and colored pixels 190 may have gain selection circuitry. For example, pixel 190C having gain selection circuitry 30 may be a colored pixel and pixel 190 having a fixed conversion gain may be a broadband pixel. In general, any suitable color channel (e.g., any group of pixels having the same spectral response) may be provided with channel-dependent gain selection circuitry.

In the illustrative examples of FIGS. 3-7, pixels are shown to include at least four transistors (4T) per pixel, and each pixel is shown to have at least one pinned photodiode. This is merely illustrative. If desired, a three transistor (3T) style pixel may be used, and photodiodes may be implemented as unpinned photodiodes. The configurations of FIGS. 3-7 are shown as illustrative examples.

Figure 8:
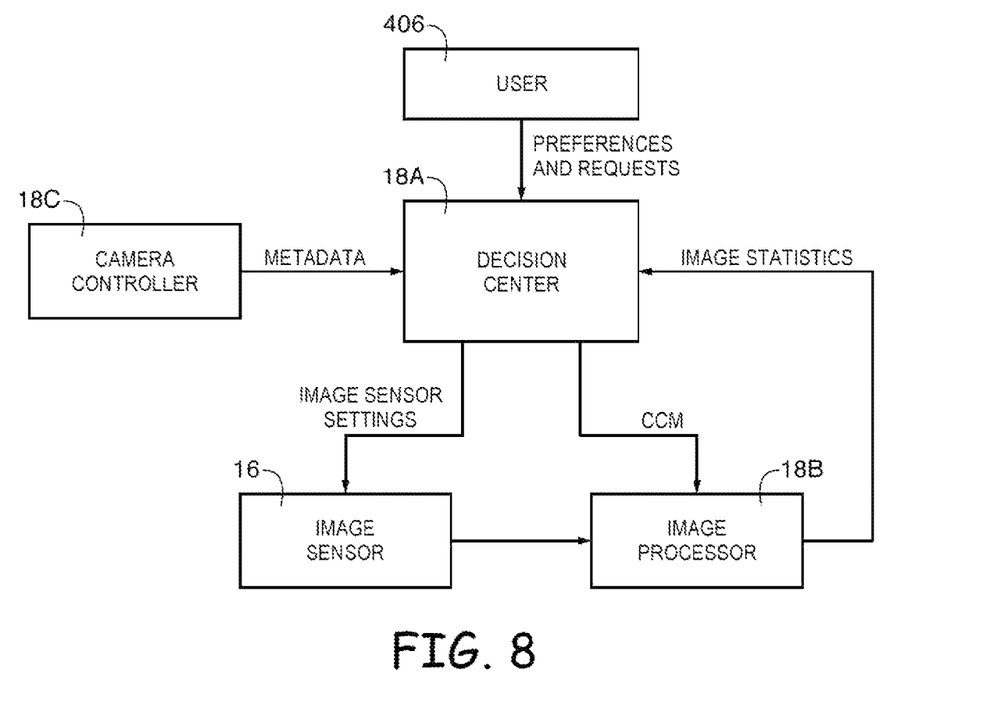
FIG. 8 is a diagram illustrating how processing circuitry gathers various inputs to determine image sensor settings and a color correction matrix that optimize image quality for an image sensor having responsivity adjustment structures in accordance with an embodiment of the present invention.

FIG. 8 is a diagram illustrating how processing circuitry gathers various inputs to determine image sensor settings and a color correction matrix that optimize image quality for an image sensor having responsivity adjustment structures. As shown in FIG. 8, a decision center such as decision center 18A may gather information from user 406, image processor 18B, and camera controller 18C. Decision center 18A may output information and instructions to image sensor 16 and image processor 18B based on the gathered information. If desired, decision center 18A, image processor 18B, and camera controller 18C may be implemented as part of storage and processing circuitry 18 of FIG. 1.

User 406 may supply preferences that may be used in customized decision-making and/or may provide requests that directly control image sensor and/or image processor behavior, bypassing or deterministically driving decision center 18A. Camera controller 18C may send metadata information to decision center 18A. Metadata information may include light level information (e.g., an inferred light level), integration time, flash firing information, etc. Image processor 18B may send image statistics to decision center 18A (e.g., image statistics derived from one or more recently captured image frames provided to image processor 18B from image sensor 16). Image statistics may include, for example, scene histograms, signal-to-noise ratio information, and illuminant information (e.g., an inferred capture illuminant such as D65, fluorescent light, etc.).

Based on this gathered information, decision center 18A may provide output settings to image sensor 16 and a CCM such as CCM 28 (FIG. 1) to image processor 18B. Output settings may, for example, include control signals for controlling the operation of responsivity adjustment structures 30. For example, in configurations where responsivity adjustment structures 30 include a skimming photodiode of the type shown in FIGS. 3 and 4, output settings may include control signals for controlling transistor 52. In configurations where responsivity adjustment structures 30 include a stacked photodiode of the type shown in FIGS. 5 and 6, output settings may include control signals for controlling transistor 60. In configurations where responsivity adjustment structures 30 include channel-dependent conversion gain circuitry of the type shown in FIG. 7, output settings may include control signals for controlling transistor 74. CCM 28 may be used by image processor 18B to convert image data from image sensor 16 into a standard format for a display (e.g., sRGB).

Figure 9:
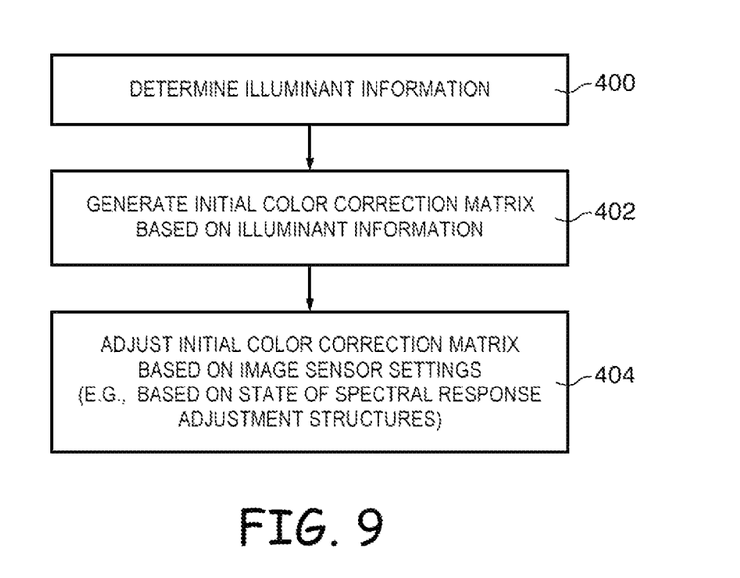
FIG. 9 is a flow chart of illustrative steps involved in determining a color correction matrix for an image sensor having responsivity adjustment structures based on illuminant information and image sensor settings in accordance with an embodiment of the present invention.

FIG. 9 is a flow chart of illustrative steps involved in determining a color correction matrix for an image sensor having responsivity adjustment structures.

In general, a "color-accurate" CCM may be defined as one that minimizes an objective color error in a defined color space over a set of test colors. A CCM (e.g., CCM 28 of FIG. 1) is typically a function of the spectral responses of the image sensor channels (e.g., a red channel, a blue channel, and a broadband channel); the spectral power distribution of the capture illuminant; and the transmittance spectra of any optical elements in the system such as infrared cutoff filters, which is typically invariant for a particular camera module design.

At step 400, processing circuitry 18 may determine illuminant information for an image frame based on image statistics (e.g., based on image statistics provided from image processor 18B to decision center 18A of FIG. 8). For example, a capture illuminant may be estimated based on the white balance gains that are inferred as part of image processing. This is, however, merely illustrative. If desired, a capture illuminant may be estimated by other suitable means (e.g., using other types of image statistics, information from separate ambient light sensors, etc.).

At step 402, processing circuitry 18 may generate an initial CCM based on the illuminant information. For example, processing circuitry 18 may use the inferred illuminant from step 400 in a look-up procedure to generate the initial CCM. The initial CCM may, for example, represent the most color-accurate CCM for an image sensor that does not include responsivity adjustment structures 30 or for an image sensor in which responsivity adjustment structures 30 are disabled.

At step 404, processing circuitry 18 may adjust the initial CCM based on image sensor settings. For example, processing circuitry 18 may adjust the initial CCM based on the state of responsivity adjustment structures 30 (e.g., based on an amount by which the responsivity of broadband pixels 190C is adjusted). In configurations where responsivity adjustment circuitry 30 includes a skimming photodiode of the type shown in FIGS. 3 and 4, the state of responsivity adjustment circuitry 30 may be determined based on whether transistor 52 is on or off. In configurations where responsivity adjustment circuitry 30 includes a stacked photodiode of the type shown in FIGS. 5 and 6, the state of responsivity adjustment circuitry 30 may be determined based on whether transistor 60 is on or off. In configurations where responsivity adjustment circuitry 30 includes channel-dependent conversion gain circuitry of the type shown in FIG. 7, the state of responsivity adjustment circuitry 30 may be determined based on whether transistor 74 is on or off. If desired, processing circuitry 18 may use one or more look-up tables or equations to determine the amounts by which the values in the initial CCM should be changed based on the state of responsivity adjustment circuitry 30.

In some situations, it may be desirable to select a CCM that minimizes error in color reproduction. In other situations, it may be desirable to optimize overall image quality, balancing degradations in multiple aspects of image quality. The presence of responsivity adjustment structures 30 in image sensor 16 means that the responsivity of one or more channels is varied. This may introduce secondary changes in exposure, integration time, and CCM, which in turn can affect color accuracy, visual SNR, and visibility of chromatic and motion artifacts. In some cases, overall image quality may be improved by sacrificing some color reproduction accuracy. For example, at lower light levels where SNR is decreased, it may improve overall image quality to decrease color saturation slightly, reducing the amplification of noise by the CCM.

Figure 10:
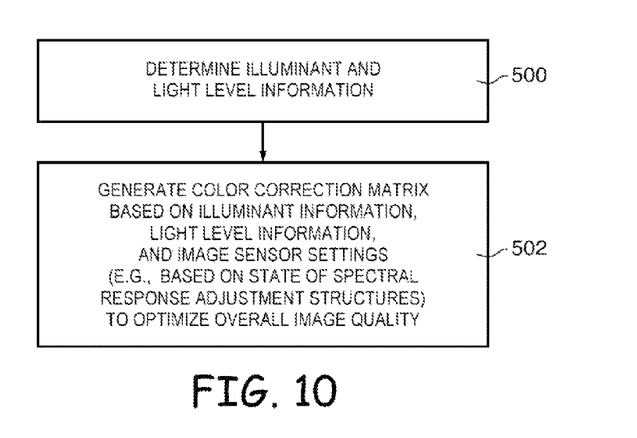
FIG. 10 is a flow chart of illustrative steps involved in determining a color correction matrix for an image sensor having responsivity adjustment structures based on illuminant information, light level information, and image sensor settings in accordance with an embodiment of the present invention.

FIG. 10 is a flow chart of illustrative steps involved in determining a color correction matrix using a multivariate optimization process that optimizes overall image quality.

At step 500, processing circuitry 18 may determine illuminant information and light level information. Processing circuitry 18 may determine illuminant information for an image frame based on image statistics (e.g., based on image statistics provided from image processor 18B to decision center 18A of FIG. 8). For example, a capture illuminant may be estimated based on the white balance gains that are inferred as part of image processing. This is, however, merely illustrative. If desired, a capture illuminant may be estimated by other suitable means (e.g., using other types of image statistics, information from separate ambient light sensors, etc.). An inferred light level may be determined based on metadata (e.g., based on metadata provided from camera controller 18C to decision center 18A of FIG. 8).

At step 502, processing circuitry 18 may generate a CCM based on the illuminant information, light level information, and image sensor settings (e.g., based on an amount by which the responsivity of broadband pixels 190C is adjusted). In configurations where responsivity adjustment circuitry 30 includes a skimming photodiode of the type shown in FIGS. 3 and 4, the state of responsivity adjustment circuitry 30 may be determined based on whether transistor 52 is on or off. In configurations where responsivity adjustment circuitry 30 includes a stacked photodiode of the type shown in FIGS. 5 and 6, the state of responsivity adjustment circuitry 30 may be determined based on whether transistor 60 is on or off. In configurations where responsivity adjustment circuitry 30 includes channel-dependent conversion gain circuitry of the type shown in FIG. 7, the state of responsivity adjustment circuitry 30 may be determined based on whether transistor 74 is on or off.

If desired, processing circuitry 18 may use one or more look-up tables or equations to determine the values in the CCM. The look-up procedure may be analogous to that of step 402 of FIG. 9 but may be of higher complexity, using the results of a multivariate optimization that balances degradations associated with noise, color inaccuracy, motion artifacts, chromatic artifacts, and other image quality factors. In addition to generating a CCM for the imaging device, processing circuitry 18 may also generate image sensor settings that optimize overall image quality.

Figure 11:
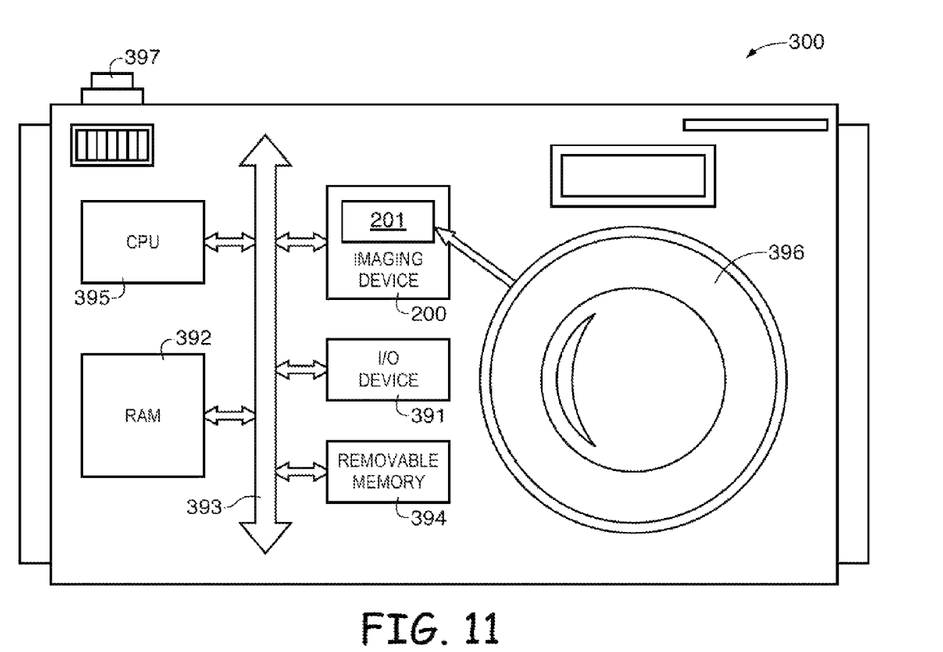
FIG. 11 is a block diagram of a system employing the embodiments of FIGS. 1-10 in accordance with an embodiment of the present invention.

FIG. 11 shows in simplified form a typical processor system 300, such as a digital camera, which includes an imaging device 200. Imaging device 200 may include a pixel array 201 (e.g., a pixel array such as pixel array 201 of FIG. 1 having responsivity adjustment structures 30). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having image sensors with pixel arrays that include responsivity adjustment structures.

The responsivity adjustment structures may include responsivity adjustment circuitry located in one or more pixels such as broadband pixels in the pixel array. The responsivity adjustment circuitry may include a skimming photodiode that collects charge generated by photons in its vicinity, thereby reducing the spectral response of the signal photodiode in the pixel. When biased by a voltage from a power supply terminal, the skimming photodiode diverts the charge to the power supply terminal. The skimming photodiode may be located deeper in a silicon substrate than the signal photodiode, and may therefore tend to collect charge generated by red photons that penetrate deeper into the silicon. Thus, when enabled (e.g., in high light conditions), the skimming photodiode may reduce the red response of the broadband pixels.

In another suitable embodiment, responsivity adjustment circuitry may include a deep photodiode that is stacked with a signal photodiode in each broadband pixel. The stacked photodiodes may be connected to or disconnected from each other using a gate. When the gate is disabled and the stacked photodiodes are disconnected (e.g., in high light conditions), the deep photodiode may collect charge generated it its vicinity (e.g., charge generated by primarily red photons that penetrate deeper into the silicon), thereby reducing the spectral response of the signal photodiode. The charge collected in each photodiode may be read out separately or may be read out as a combined signal.

In another suitable embodiment, responsivity adjustment circuitry may include channel-dependent conversion gain circuitry. For example, pixels corresponding to a first color channel may have conversion gain selection circuitry, whereas pixels corresponding to a second color channel may have fixed conversion gains. In one example, broadband pixels are provided with dual conversion gain circuitry, while colored pixels have fixed conversion gains. The channel-dependent gain selection circuitry may allow the conversion gain of broadband pixels to be controlled independently of the colored pixels. This allows the conversion gain of broadband pixels to be reduced at high light levels when the broadband channel may otherwise be at risk of saturating. Reducing the conversion gain of broadband pixels allows a longer integration time to be used for all color channels in the image sensor, increasing the SNR of color channels while leaving the SNR of the broadband color channel unaffected.

Processing circuitry in the imaging device may adjust the CCM based on the state of responsivity structures (e.g., based on an amount by which the responsivity of one or more pixels is adjusted using the responsivity adjustment structures). The CCM may be determined using a multivariate optimization process that balances degradations associated with noise, color inaccuracy, motion artifacts, chromatic artifacts, and other image quality factors.

The foregoing is merely illustrative of the principles of this invention which can be practiced in other embodiments.

What is claimed is:

1. An image sensor, comprising:
   a substrate;
   an image pixel array formed in the substrate, wherein the image pixel array includes first and second groups of image pixels and wherein each image pixel in the first and second groups of image pixels comprises a signal photodiode; and
   spectral response adjustment circuitry in each image pixel in the first group of image pixels, wherein the spectral response adjustment circuitry comprises a responsivity adjustment photodiode that is configured to divert charge from the signal photodiode,
   wherein the first group of image pixels comprises broadband image pixels having broadband color filter elements, wherein the second group of image pixels comprises red and blue image pixels having red and blue color filter elements, and
   wherein the responsivity adjustment photodiode is surrounded on three sides by the signal photodiode in the substrate.

2. The image sensor defined in claim 1 wherein the substrate has a surface through which light enters, wherein the signal photodiode is located a first distance from the surface, wherein the responsivity adjustment photodiode is located a second distance from the surface, and wherein the first distance is less than the second distance.

3. The image sensor defined in claim 2, further comprising:
   a transistor that is electrically coupled between the signal photodiode and the responsivity adjustment photodiode.

4. The image sensor defined in claim 3, wherein the signal photodiode and the responsivity adjustment photodiode comprise a first doping type, and wherein the signal photodiode is separated from the responsivity adjustment photodiode by a semiconductor region having a second doping type that is different than the first doping type.

5. The image sensor defined in claim 4, wherein the first doping type is n-type and the second doping type is p-type.

6. The image sensor defined in claim 1 wherein the broadband color filter elements are each configured to pass at least two colors of light selected from the group consisting of: red light, green light, and blue light.

7. The image sensor defined in claim 1, wherein the broadband color filter elements are each configured to pass red light, green light, and blue light.

8. The image sensor defined in claim 1, wherein the broadband color filter elements are each configured to pass red light and green light.

9. The image sensor defined in claim 1, further comprising:
a transistor that is electrically coupled between the signal photodiode and the responsivity adjustment photodiode.

10. An image sensor, comprising:
a substrate;
an image pixel array formed in the substrate, wherein the image pixel array includes first and second groups of image pixels and wherein each image pixel in the first and second groups of image pixels comprises a signal photodiode;
spectral response adjustment circuitry in each image pixel in the first group of image pixels, wherein the spectral response adjustment circuitry comprises a responsivity adjustment photodiode that is stacked with the signal photodiode and that is configured to divert charge from the signal photodiode; and
a transistor electrically coupled between the signal photodiode and the responsivity adjustment photodiode that is configured to electrically connect and disconnect the signal photodiode and the responsivity adjustment photodiode.

11. The image sensor defined in claim 10 wherein the substrate has a surface through which light enters, wherein the signal photodiode is located a first distance from the surface, wherein the responsivity adjustment photodiode is located a second distance from the surface, and wherein the first distance is less than the second distance.

12. The image sensor defined in claim 11 wherein the signal photodiode and the responsivity adjustment photodiode are configured to collect charge separately when the transistor disconnects the responsivity adjustment photodiode from the signal photodiode.

13. The image sensor defined in claim 12 wherein each image pixel in the first group of image pixels further comprises a transfer gate and a floating diffusion node, wherein the charge collected by the responsivity adjustment photodiode is transferred to the floating diffusion node by pulsing the transfer gate while the transistor is enabled.

14. The image sensor defined in claim 10 wherein the first group of image pixels comprises broadband image pixels having broadband color filter elements and wherein the second group of image pixels comprises red and blue image pixels having red and blue color filter elements.

* * * * *